(12) United States Patent
Kim et al.

(10) Patent No.: US 11,390,635 B2
(45) Date of Patent: Jul. 19, 2022

(54) COMPOSITION FOR DEPOSITING SILICON-CONTAINING THIN FILM AND METHOD FOR PRODUCING SILICON-CONTAINING THIN FILM USING THE SAME

(71) Applicant: DNF CO., LTD., Daejeon (KR)

(72) Inventors: Sung Gi Kim, Daejeon (KR); Joong Jin Park, Daejeon (KR); Byeong-il Yang, Daejeon (KR); Se Jin Jang, Jeju-Si (KR); Gun-Joo Park, Daejeon (KR); Jeong Joo Park, Daejeon (KR); Hee Yeon Jeong, Jecheon-Si (KR); Sam Dong Lee, Daejeon (KR); Sang Ick Lee, Daejeon (KR); Myong Woon Kim, Daejeon (KR)

(73) Assignee: DNF CO., LTD., Daejeon (KR)

( * ) Notice: Subject to any disclaimer, the term of this patent is extended or adjusted under 35 U.S.C. 154(b) by 44 days.

(21) Appl. No.: 16/766,188

(22) PCT Filed: Nov. 22, 2018

(86) PCT No.: PCT/KR2018/014474
§ 371 (c)(1),
(2) Date: May 21, 2020

(87) PCT Pub. No.: WO2019/103500
PCT Pub. Date: May 31, 2019

(65) Prior Publication Data
US 2020/0361966 A1 Nov. 19, 2020

(30) Foreign Application Priority Data

Nov. 22, 2017 (KR) .................. 10-2017-0156464
Nov. 21, 2018 (KR) .................. 10-2018-0144899

(51) Int. Cl.
| | | |
|---|---|---|
| C07F 7/10 | (2006.01) | |
| C01B 33/027 | (2006.01) | |
| C23C 16/34 | (2006.01) | |
| C23C 16/40 | (2006.01) | |
| C23C 16/46 | (2006.01) | |

(52) U.S. Cl.
CPC .............. *C07F 7/10* (2013.01); *C01B 33/027* (2013.01); *C23C 16/345* (2013.01); *C23C 16/402* (2013.01); *C23C 16/46* (2013.01)

(58) Field of Classification Search
CPC ....... C07F 7/10; C01B 33/027; C23C 16/345; C23C 16/402; C23C 16/46
See application file for complete search history.

(56) References Cited

U.S. PATENT DOCUMENTS

| | | | |
|---|---|---|---|
| 2014/0363985 A1* | 12/2014 | Jang .......................... | C07F 7/10 556/412 |
| 2017/0107614 A1* | 4/2017 | Lee .................. | C23C 16/45551 |
| 2017/0125243 A1* | 5/2017 | Jang ..................... | C23C 16/345 |
| 2019/0249296 A1* | 8/2019 | Jang ..................... | C23C 16/345 |
| 2021/0147451 A1* | 5/2021 | Kim .................. | C23C 16/45536 |

FOREIGN PATENT DOCUMENTS

| | | | | |
|---|---|---|---|---|
| JP | 2017518286 A | | 7/2017 | |
| KR | 1020070055898 A | | 5/2007 | |
| KR | 1020140143681 A | | 12/2014 | |
| KR | 1020140143682 A | | 12/2014 | |
| KR | 1020170045138 A | | 4/2017 | |
| KR | 1020170058957 A | | 5/2017 | |
| KR | 20170124108 A | * | 11/2017 | |
| KR | 1020170124108 A | | 11/2017 | |
| WO | WO-2015190749 A1 | * | 12/2015 | ....... C23C 16/45557 |

OTHER PUBLICATIONS

J. Park et al., ACS Applied Materials & Interfaces, 20865-20871 (2016) (Year: 2016).*
W. Wiberg et al., 120 Chem. Ber., 1203-1212 (1987) (Year: 1987).*
Japanese Patent Office, Office Action Issued in Application No. 2020-528179, dated Jul. 6, 2021, 9 pages. (Submitted with Machine Translation).
ISA Korean Intellectual Property Office, International Search Report Issued in Application No. PCT/KR2018/014474, dated Feb. 28, 2019, WIPO, 4 pages.
State Intellectual Property Office of the People's Republic of China, Office Action and Search Report Issued in Application No. 201880075454.1, dated Sep. 3, 2021, 14 pages. (Submitted with Partial Translation).

* cited by examiner

Primary Examiner — Alexander R Pagano
(74) Attorney, Agent, or Firm — McCoy Russell LLP

(57) ABSTRACT

Provided are a composition for depositing a silicon-containing thin film, containing a trisilylamine compound and a method for producing a silicon-containing thin film using the same, and more particularly, a composition for depositing a silicon-containing thin film, containing a trisilylamine compound which is capable of forming a silicon-containing thin film at a very high deposition rate at a low temperature to be usable as a precursor of a silicon-containing thin film and an encapsulant of a display, and a method for producing a silicon-containing thin film by using the same.

14 Claims, 2 Drawing Sheets

COMPOSITION FOR DEPOSITING SILICON-CONTAINING THIN FILM AND METHOD FOR PRODUCING SILICON-CONTAINING THIN FILM USING THE SAME

CROSS-REFERENCE TO RELATED APPLICATIONS

The present application is a U.S. National Phase of International Patent Application Serial No. PCT/KR2018/014474 entitled "COMPOSITION FOR DEPOSITION OF SILICON-CONTAINING THIN FILM, AND METHOD FOR MANUFACTURING SILICON-CONTAINING THIN FILM BY USING SAME," filed on Nov. 22, 2018. International Patent Application Serial No. PCT/KR2018/014474 claims priority to Korean Patent Application No. 10-2017-0156464 filed on Nov. 22, 2017 and Korean Patent Application No. 10-2018-0144899 filed on Nov. 21, 2018. The entire contents of each of the above-referenced applications are hereby incorporated by reference for all purposes.

TECHNICAL FIELD

The present invention relates to a composition for depositing a silicon-containing thin film and a method for producing a silicon-containing thin film using the same, and more particularly, to a composition for deposition containing a trisilylamine compound as a precursor for depositing a thin film and a method for producing a silicon-containing thin film using the same.

BACKGROUND ART

A silicon-containing thin film is manufactured in various forms of thin films, such as a silicon film, a silicon oxide film, a silicon nitride film, a silicon carbonitride film, a silicon oxynitride film, and the like, by various deposition processes in the field of semiconductors, and has a wide range of application fields.

In particular, the silicon oxide film and the silicon nitride film are used as an insulating film, a diffusion prevention film, a hard mask, an etching stop layer, a seed layer, a spacer, trench isolation, intermetallic dielectric material and a protective layer in manufacturing a device, due to significantly excellent block property and oxidation resistance.

Recently, a polycrystalline silicon thin film has been employed for a thin film transistor (TFT), a solar cell, and the like, and therefore, application fields thereof are gradually diversified.

As a representative technology known for manufacturing a silicon-containing thin film, there are metal organic chemical vapor deposition (MOCVD) forming a film on a surface of a substrate to be deposited by reacting a silicon precursor in a mixed gas form and a reactive gas, or forming a film by direct reaction on the surface, and atomic layer deposition (ALD) forming a film by physical or chemical adsorption of a silicon precursor in a gas form on a surface of a substrate to be deposited, followed by sequential addition of a reactive gas. In addition, various technologies for manufacturing a thin film such as low pressure chemical vapor deposition (LPCVD) using the same, plasma enhanced chemical vapor deposition (PECVD), and plasma enhanced atomic layer deposition (PEALD) using plasma capable of being deposited at a low temperature, and the like, are applied to next-generation semiconductor and display device manufacturing processes, thereby being used to form ultra-fine patterns and deposit ultra-thin film having uniform and excellent properties at a nano-sized thickness.

Representative examples of a precursor used in forming a silicon-containing thin film as described in Korean Patent Laid-Open Publication No. KR 2007-0055898 include silanes, silane chlorides, amino silanes and alkoxysilanes, and more specifically, silane chlorides such as dichlorosilane ($SiH_2Cl_2$) and hexachlorodisilane ($Cl_3SiSiCl_3$) and trisilylamine ($N(SiH_3)_3$), bis-diethylaminosilane ($H_2Si(N(CH_2CH_3)_2)_2$) and di-isopropylaminosilane ($H_3SiN(i-C_3H_7)_2$), and the like, and the precursor has been used for a mass production of a semiconductor and a display.

However, a technology for forming an ultra-fine thin film having a uniform and thin thickness and excellent electrical properties at a desired low temperature has been demanded according to miniaturization of devices caused by ultra-high integration of the devices, an increase in an aspect ratio, and diversification of device material, and thus, a high temperature process at 600° C. or more, step coverage, etching property, and physical and electrical properties of a thin film at the time of using the existing silicon precursor are emerging as an issue. Therefore, the development of a better silicon precursor and a method for forming a thin film are being studied.

RELATED ART DOCUMENT (Patent Document) Korean Patent Laid-Open Publication No. KR 2007-0055898

Technical Problem

An embodiment of the present invention is directed to providing a composition for depositing a silicon-containing thin film containing a trisilylamine compound which is usable as a precursor of silicon.

Specifically, the present invention provides a composition for deposition that has a high deposition rate at a very low deposition temperature and is capable of producing a silicon-containing thin film with high purity and high-stress.

Another embodiment of the present invention is directed to providing a composition for deposition capable of producing a silicon-containing thin film having excellent water vapor permeability.

Still another embodiment of the present invention is directed to providing a method for producing a silicon-containing thin film using the compound for depositing a silicon-containing thin film.

Technical Solution

In one general aspect, there is provided a composition for depositing a silicon-containing thin film containing a trisilylamine compound represented by Chemical Formula 1 below:

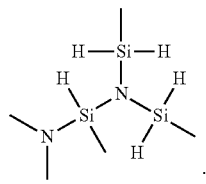

(Chemical Formula 1)

The composition may be used for low temperature deposition in which a temperature of a substrate to be deposited is less than 100° C.

In another general aspect, there is provided a method for producing a silicon-containing thin film using the composition for depositing a silicon-containing thin film described above.

The method for producing a silicon-containing thin film may include supplying a trisilylamine compound represented by Chemical Formula 1 below to a chamber in which a substrate to be deposited is placed:

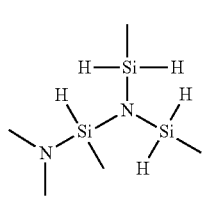

(Chemical Formula 1)

A temperature of the substrate to be deposited may be less than 100° C.

The temperature of the substrate to be deposited may be 95° C. or less.

A deposition rate of a silicon nitride film which is a silicon-containing thin film may be 8 Å/min or more.

A deposition rate of a silicon oxide film which is a silicon-containing thin film may be 70 Å/min or more.

Before, during, and/or after the supplying of the trisilylamine compound, any one or two or more gases may be supplied, the gases being selected from oxygen ($O_2$), ozone ($O_3$), distilled water ($H_2O$), hydrogen peroxide ($H_2O_2$), nitrogen monoxide (NO), nitrous oxide ($N_2O$), nitrogen dioxide ($NO_2$), ammonia ($NH_3$), nitrogen ($N_2$), hydrazine ($N_2H_4$), hydrazine derivatives, diamines, carbon monoxide (CO), carbon dioxide ($CO_2$), C1-C12 saturated or unsaturated hydrocarbons, hydrogen, argon, and helium.

The method may include: a) heating and maintaining a substrate to be deposited which is placed in the chamber to a deposition temperature; b) contacting the substrate to be deposited with the trisilylamine compound and adsorbing the trisilylamine compound onto the substrate to be deposited; and c) injecting a reactive gas into the substrate to be deposited on which the trisilylamine compound is adsorbed.

Steps a) to c) may be performed in one cycle, and a deposition rate of the silicon nitride film per cycle may be 0.65 Å/cycle or more.

Steps a) to c) may be performed in one cycle, and a deposition rate of the silicon oxide film per cycle may be 2.5 Å/cycle or more.

The reactive gas may be selected from an oxygen-containing gas, a nitrogen-containing gas, a carbon-containing gas, an inert gas, or a mixed gas thereof, and may be a plasma-activated gas.

The silicon-containing thin film may be one or two or more selected from a silicon oxide thin film, a silicon oxycarbide thin film, a silicon carbonitride thin film, a silicon nitride thin film, a silicon oxynitride thin film, a silicon oxycarbonitride thin film, and a silicon carbide thin film.

In still another general aspect, there is provided a silicon-containing thin film produced by the method described above.

Advantageous Effects

The composition for depositing a silicon-containing thin film according to the present invention is a liquid at room temperature, and includes a trisilylamine compound having high volatility and very good thermal stability as a silicon precursor, thereby having an advantage of producing a high-quality silicon-containing thin film having high purity and durability at a lower film formation temperature condition with a high deposition rate.

Further, the method for producing a silicon-containing thin film using the composition for depositing a silicon-containing thin film of the present invention is capable of realizing a high deposition rate, excellent stress intensity, and a significantly low water vapor permeability even under a low film-forming temperature condition, and further, the silicon-containing thin film produced therefrom is advantageous in that since amounts of impurities such as carbon, oxygen, hydrogen, and the like, are minimized, the purity is high, physical and electrical characteristics are very good, and resistance to hydrogen fluoride is excellent.

In particular, the silicon-containing thin film produced by using the composition for depositing a silicon-containing thin film of the present invention has excellent stress intensity and remarkably low water vapor permeability, thereby being very useful for an encapsulant in the fields of a semiconductor or a display, and further being capable of forming the encapsulant at a very high deposition rate at 100° C. or less, and thus a protection object to be protected by the encapsulant is free from thermal damage.

DETAILED DESCRIPTION OF EMBODIMENTS

Figure 1:
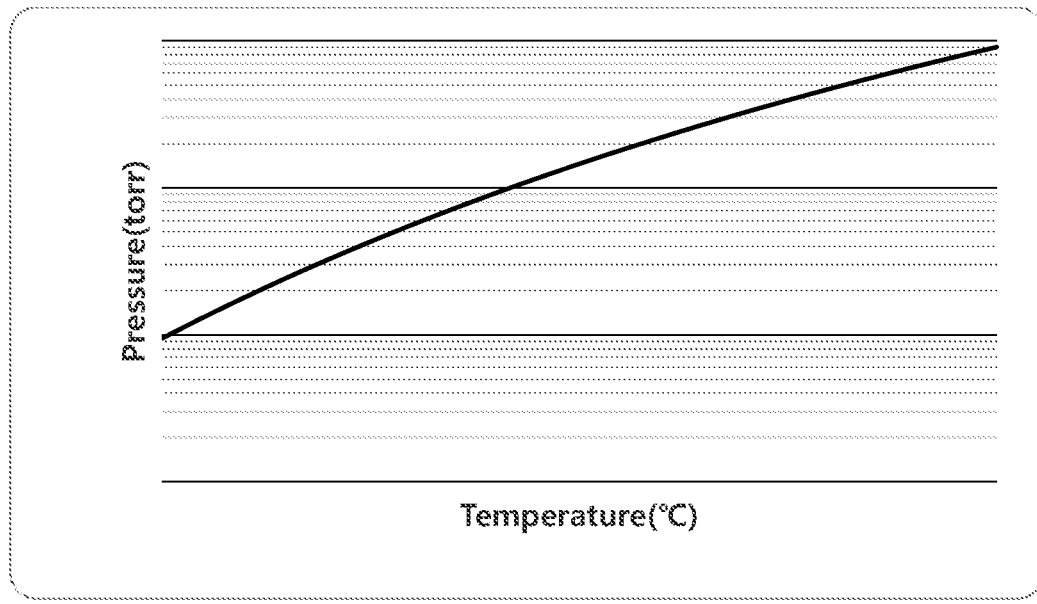
FIG. 1 is a graph showing vapor pressure measurement results of a bis(methylsilyl)dimethylamino methylsilylamine compound prepared in Example 1.

Hereinafter, a composition for depositing a silicon-containing thin film of the present invention is described in detail with reference to the accompanying drawings. Technical terms and scientific terms used in the present specification have the general meaning understood by those skilled in the art to which the present invention pertains unless otherwise defined, and a description for the known function and configuration obscuring the present invention will be omitted in the following description and the accompanying drawings.

The composition for depositing a silicon-containing thin film according to the present invention contains a trisilylamine compound represented by Chemical Formula 1 below. In other words, the present invention includes a compound for depositing a silicon-containing thin film including a trisilylamine compound represented by Chemical Formula 1 below:

(Chemical Formula 1)

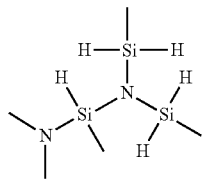

The trisilylamine compound represented by Chemical Formula 1 above is liquid at room temperature, has a high volatility and excellent thermal stability, and is capable of depositing a thin film with a remarkably excellent deposition rate and producing a high-quality silicon-containing thin film having high purity and high durability.

Specifically, as shown in Chemical Formula 1, based on a tri-planar $Si_3N$ molecular structure type in which a trisilylamine compound has three silicon atoms bonded to a central nitrogen atom, two hydrogens and methyl are bonded to each of the two silicones, and one methylamine, one hydrogen and one methyl are bonded to the remaining one silicon, and thus, finally, it is possible to form a stable liquid compound at room temperature and atmospheric pressure, to have excellent volatility with a vapor pressure of 10 torr or more at 70° C. and to have a very high deposition rate even in a low temperature deposition of less than 100° C. and only 90° C. as a substantial example. Specifically, the silicon nitride film may have a deposition rate of 8 Å/min or more, and further, the silicon oxide film may have a remarkably excellent deposition rate of 70 Å/min or more. Together with this case, or independently, even in a case where deposition is performed based on a cycle of supplying and purging the reactive gas, and even in low temperature deposition with only 90° C. the deposition rate of the silicon nitride film may be 0.6 Å/cycle or more, and further, the deposition rate of the silicon oxide film may be 2.5 Å/cycle or more.

In addition, when the silicon-containing thin film is formed using the trisilylamine compound represented by Chemical Formula 1, excellent cohesion and excellent step coverage may be obtained. In addition, since the trisilylamine compound has the structure represented by Chemical Formula 1, and thus a silicon-containing thin film having high thermal stability, low activation energy, and excellent reactivity without generating non-volatile byproducts to achieve high purity and excellent stress intensity is capable of being easily formed.

Thus, the composition for depositing a silicon-containing thin film according to the present invention may be a composition for low temperature deposition in which a temperature of a substrate to be deposited with the silicon-containing thin film is less than 100° C. and specifically, may be a composition for low temperature deposition in which a temperature of the substrate to be deposited is 60° C. or more to less than 100° C. and more specifically, 60° C. to 95° C.

However, the use of the low temperature deposition is possible due to excellent properties provided by the silicon precursor for deposition such as excellent low temperature volatility, high reactivity, and the like, of the trisilylamine compound represented by Chemical Formula 1 described above, and thus the composition of the present invention should not be limited to low temperature deposition, and may be used, if necessary, at general deposition temperatures (temperatures of the substrate to be deposited ranging from 100 to 700° C. and more specifically from 400 to 700° C.).

The trisilylamine compound represented by Chemical Formula 1 of the present invention may be prepared by a method which is possibly performed within a range recognizable by a person skilled in the art.

In addition, the present invention includes a method for producing a silicon-containing thin film using the composition for depositing a silicon-containing thin film described above. In other words, the present invention includes a method for producing a silicon-containing thin film using the trisilylamine compound represented by Chemical Formula 1 of the present invention.

The method for producing a silicon-containing thin film according to the present invention includes a step of supplying the trisilylamine compound represented by Chemical Formula 1 below to a substrate to be deposited:

(Chemical Formula 1)

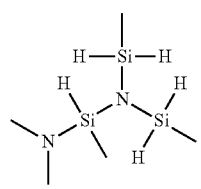

In the method for producing a silicon-containing thin film according to the present invention, the trisilylamine compound represented by Chemical Formula 1, which is liquid at room temperature and has high volatility and excellent thermal stability, may be used as a silicon precursor, thereby having easy handleability and being capable of producing various thin films and producing a silicon-containing thin film having excellent purity with a high deposition rate even at low temperature and/or low power. Further, the silicon-containing thin film produced by the production method of the present invention has excellent durability and electrical characteristics, and also has excellent resistance to hydrogen fluoride.

Due to the extremely excellent properties of the trisilylamine compound represented by Chemical Formula 1 described above as a Si precursor for deposition such as excellent low temperature volatility and high reactivity, and the like, the temperature of the substrate to be deposited which is placed in an inner part of the chamber may be less than 100° C. and characteristically, 95° C. or less. The deposition of the silicon-containing thin film including the step of supplying the trisilylamine compound represented by Chemical Formula 1 to the chamber in which the substrate to be deposited is placed may be performed at a low temperature of less than 100° C. and characteristically 95° C. or less.

More specifically, the temperature of the substrate to be deposited may be 60° C. or more to less than 100° C. and more specifically, 60° C. to 95° C. In other words, the temperature for depositing the silicon-containing thin film may be 60° C. or more to less than 100° C. and more specifically, 60° C. to 95° C.

In other words, the production method according to an embodiment of the present invention may include: heating and maintaining the substrate to be deposited which is placed in the chamber to a deposition temperature; and supplying the trisilylamine compound represented by Chemical Formula 1 to the substrate to be deposited placed in the chamber, wherein the deposition temperature may be less than 100° C. more specifically 95° C. or less, and even more specifically, 60° C. to 95° C.

An extremely excellent deposition rate under the low-temperature deposition condition is a deposition rate which is possible by supplying a trisilylamine compound represented by Chemical Formula 1 to a chamber in which a substrate to be deposited is placed and depositing a silicon-containing thin film.

The low temperature deposition having the commercially significant high deposition rate may be achieved due to excellent properties provided as the silicon precursor for deposition such as excellent low temperature volatility, high reactivity, and the like, of the trisilylamine compound represented by Chemical Formula 1 described above, and thus the production method of the present invention should not be limited to low temperature deposition, and the deposition may be performed, if necessary, at general deposition temperatures (temperatures of the substrate to be deposited ranging from 100 to 700° C. and more specifically from 400 to 700° C.).

The silicon-containing thin film may be any thin film as long as it is capable of being produced within a range recognizable by a person skilled in the art in the present technology field in which the silicon-containing thin film is produced by supplying a silicon precursor in a gas phase. As a specific and substantial example, the silicon-containing thin film may be one or two or more thin films selected from a silicon oxide thin film, a silicon oxycarbide (SiOC) thin film, a silicon carbonitride (SiCN) thin film, a silicon nitride thin film, a silicon oxynitride (SiON) thin film, a silicon oxycarbonitride (SiOCN) thin film, and a silicon carbide thin film, and may be various high-quality thin films containing silicon within a range recognizable by a person skilled in the art.

The method for producing a silicon-containing thin film according to the present invention may be any method as long as it is capable of being performed within a range recognizable by a person skilled in the art in the present technology field. Preferable examples of the method may include atomic layer deposition (ALD), chemical vapor deposition (CVD), organometallic chemical vapor deposition (MOCVD), low pressure chemical vapor deposition (LPCVD), plasma enhanced chemical vapor deposition (PECVD) or plasma enhanced atomic layer deposition (PEALD), and the like. The PEALD is preferable from the viewpoint that it is easier to perform deposition of the thin film and the produced thin film has excellent characteristics. Accordingly, the above-described composition for depositing silicon-containing thin film according to the present invention may be a composition for plasma enhanced chemical vapor deposition for producing the silicon-containing thin film.

In the production method according to an embodiment of the present invention, before, during, and/or after the supplying of the trisilylamine compound to the chamber in which the substrate to be deposited is placed, a reactive gas, such as an oxygen-containing gas, a nitrogen-containing gas, a carbon-containing gas, an inert gas, or a mixed gas thereof, may be supplied to the chamber. The reactive gas may be used as long as it is a gas commonly used together with a silicon precursor in consideration of a material of the silicon-containing thin film to be produced. As specific examples, the oxygen-containing gas is oxygen ($O_2$), ozone ($O_3$), distilled water ($H_2O$), hydrogen peroxide ($H_2O_2$), or the like, the nitrogen-containing gas is nitrogen monoxide (NO), nitrous oxide ($N_2O$), nitrogen dioxide ($NO_2$), ammonia ($NH_3$), nitrogen ($N_2$), hydrazine ($N_2H_4$), hydrazine derivatives (tertiarybutyl hydrazine ($C_4H_{12}N_2$), and the like,), diamines, or the like, the carbon-containing gas is carbon monoxide (CO), carbon dioxide ($CO_2$), C1-C12 saturated or unsaturated hydrocarbons, or the like, the inert gas is nitrogen, argon, or the like, and the other reactive gas is hydrogen, helium, or the like. Any one or two or more gases selected from the above oxygen-containing gas, nitrogen-containing gas, carbon-containing gas, inert gas or other reactive gas may be included as the reactive gas, but the present invention is not limited thereto. When the reactive gas is the oxygen-containing gas, a ligand of the trisilylamine compound according to Chemical Formula 1 may be removed to form a Si—O atomic layer. When the reactive gas is the nitrogen-containing gas, a ligand of the trisilylamine compound according to Chemical Formula 1 may be removed to form a Si—N atomic layer. When the reactive gas is the carbon-containing gas, a ligand of the trisilylamine compound according to Chemical Formula 1 may be removed to form a Si—C atomic layer.

In the production method according to an embodiment of the present invention, at the time of low temperature deposition where the temperature of the substrate to be deposited is less than 100° C. the deposition rate of the silicon nitride film in the silicon-containing thin film may be 8 Å/min or more. In particular, when the reactive gas is an oxygen-containing gas and the low temperature deposition where the temperature of the substrate to be deposited is less than 100° C. is performed, the deposition rate of the silicon oxide film in the silicon-containing thin film may be 70 Å/min or more, depending on the type of the reactive gas.

The trisilylamine compound represented by Chemical Formula 1 and the reactive gas may be supplied to the chamber organically or independently of each other. Further, the trisilylamine compound represented by Chemical Formula 1 and the reactive gas may be supplied to the chamber in a continuous manner or in a discontinuous manner, respectively, and the supply in the discontinuous manner may include a pulse form. Further, the reactive gas may be in a state of being activated by plasma. Here, as described above, the reactive gas activated by plasma may be any one or a mixed gas of two or more selected from oxygen ($O_2$), ozone ($O_3$), distilled water ($H_2O$), hydrogen peroxide ($H_2O_2$), nitrogen monoxide (NO), nitrous oxide ($N_2O$), nitrogen dioxide ($NO_2$), ammonia ($NH_3$), nitrogen ($N_2$), hydrazine ($N_2H_4$), hydrazine derivatives, diamines, carbon monoxide (CO), carbon dioxide ($CO_2$), C1-C12 saturated or unsaturated hydrocarbons, hydrogen, argon, and helium, but the reactive gas is not necessarily limited thereto.

As a specific example, the production method according to an embodiment of the present invention may include: a) heating and maintaining a substrate to be deposited which is placed in the chamber to a deposition temperature; b) contacting the substrate to be deposited with the trisilylamine compound and adsorbing the trisilylamine compound onto the substrate to be deposited; and c) injecting a reactive gas into the substrate to be deposited on which the trisilylamine compound is adsorbed.

Characteristically, the production method according to an embodiment of the present invention may include: a) heating and maintaining a substrate to be deposited which is placed in the chamber to a temperature less than 100° C. b)

contacting the substrate to be deposited with the trisilylamine compound and adsorbing the trisilylamine compound onto the substrate to be deposited; and c) injecting a reactive gas into the substrate to be deposited on which the trisilylamine compound is adsorbed.

Here, after step b) and/or step c), a step of purging by supplying an inert gas in the chamber may be further performed. In other words, the production method according to an embodiment of the present invention may include: a) heating and maintaining a substrate to be deposited which is placed in the chamber to a deposition temperature; b) contacting the substrate to be deposited with the trisilylamine compound and adsorbing the trisilylamine compound onto the substrate to be deposited; d1) purging an inner part of the chamber using an inert gas; c) injecting a reactive gas into the substrate to be deposited on which the trisilylamine compound is adsorbed; and d2) purging an inner part of the chamber using an inert gas.

The method for producing a silicon-containing thin film according to an embodiment of the present invention may control deposition conditions according to structure or thermal characteristics of a thin film to be desired. Examples of the deposition conditions according to an embodiment of the present invention may include a flow rate of the composition for depositing a silicon-containing thin film containing the trisilylamine compound, a flow rate of a reactive gas, a flow rate of a carrier gas, a pressure, a temperature of a substrate to be deposited, and the like. As non-limiting examples of the deposition conditions, in the composition for depositing a silicon-containing thin film, specifically, the flow rate of trisilylamine compound represented by Chemical Formula 1 may be controlled to be 10 to 1000 cc/min, the flow rate of the carrier gas may be controlled to be 10 to 1000 cc/min, the flow rate of the reactive gas may be controlled to be 1 to 1,500 cc/min, the pressure may be controlled to be 0.5 to 10 torr, and the temperature of a substrate to be deposited may be controlled within a range of 30 to 700° C. specifically 60 to 200° C. characteristically 60° C. or more to less than 100° C. and more characteristically 60° C. to 95° C. and these deposition conditions are not limited thereto. Further, according to an advantageous example, when the reactive gas is in a state of being activated by plasma, i.e., the deposition is performed using the plasma enhanced atomic layer deposition (PEALD), an RF power may be 50 to 1000 W, but is not necessarily limited thereto.

The substrate to be deposited used in the method for producing a silicon-containing thin film according to an embodiment of the present invention may include a semiconductor substrate including one or more semiconductor materials among Si, Ge, SiGe, GaP, GaAs, SiC, SiGeC, InAs and InP; a silicon on insulator (SOI) substrate; a quartz substrate; or a glass substrate for a display; a flexible plastic substrate such as polyimide, polyethylene terephthalate (PET), polyethylene naphthalate (PEN), poly methyl methacrylate (PMMA), polycarbonate (PC), polyether sulfone (PES), polyester, and the like, but the substrate to be deposited is not limited thereto.

In addition, the silicon-containing thin film may be formed with a plurality of conductive layers, dielectric layers, insulating layers, or the like between the substrate to be deposited and the silicon-containing thin film, in addition to thin films formed directly on the substrate to be deposited.

Further, the present invention also provides a trisilylamine compound usable as a precursor of the silicon-containing thin film, and the trisilylamine compound of the present invention is represented by Chemical Formula 1 below:

(Chemical Formula 1)

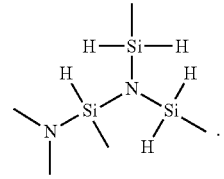

The trisilylamine compound represented by Chemical Formula 1 is liquid at room temperature and has high volatility and high thermal stability to be used as a precursor which is very useful for forming a silicon-containing thin film as described above. Further, the trisilylamine compound has excellent reactivity to be capable of depositing a thin film at an excellent thin film deposition rate even at a low temperature and to be capable of producing a thin film with high purity and high durability.

Hereinafter, the present invention is described in more detail with reference to the following Examples. Terms and words used in the present specification and claims should not be construed as being limited to a conventional or dictionary meaning but should be construed as meaning and concepts meeting the technical ideas of the present invention based on a principle that the inventors can appropriately define the concepts of terms in order to describe their own inventions in best mode.

Therefore, the configurations described in the embodiments and drawings of the present invention are merely most preferable embodiments but do not represent all of the technical spirit of the present invention. Thus, the present invention should be construed as including all the changes, equivalents, and substitutions included in the spirit and scope of the present invention at the time of filing this application.

Further, all Examples below were performed using a known plasma enhanced atomic layer deposition (PEALD) method with a commercially available showerhead type 200 mm single wafer type ALD equipment (CN1, Atomic Premium). Further, all Examples below were performed using a known plasma-enhanced chemical vapor deposition (PECVD) method with a commercially available showerhead type 200 mm single wafer type CVD (PECVD) equipment (CN1, Atomic Premium).

In the deposited silicon-containing thin film, a thickness was measured using an ellipsometer (OPTI-PROBE 2600, THERMA-WAVE), and infrared spectroscopy (IFS66V/S & Hyperion 3000, Bruker Optics), X-ray photoelectron spectrometer, and water vapor transmission rate (WVTR, MOCON, Aquatran 2) were used for measurement. In the measurement, an amount of nitrogen was 20 ml/min·Air, and an area for measuring water vapor permeability was set to 50 cm². Stress was measured using a stress gauge (Frontier Semiconductor, FSM500TC) while setting an area for measuring stress was set to 160 mm, a silicon wafer thickness was set to 0.725 μm, and thus thin film characteristics were analyzed.

EXAMPLE 1

Preparation of Bis(Methylsilyl)Dimethylaminomethylsilyl Amine

Step 1: Preparation of bis(dimethylamino)methylsilyl amine

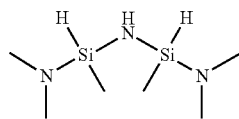

500 g (3.1 mol) of hexamethyldisilazane ((($CH_3)_3Si)_2NH$) was added to a flame-dried 2000 mL Schlenk flask under an anhydrous and inert atmosphere, 1,425 g (12.4 mol) of dichloromethylsilane (($CH_3)Cl_2SiH$) was added slowly while maintaining a temperature to $-25°$ C. and then the obtained reaction solution was slowly heated to $10°$ C. and stirred for 3 hours. Chlorotrimethylsilane (($CH_3)_3SiCl$) produced in this mixed reaction solution and excessively added dichloromethylsilane (($CH_3)Cl_2SiH$) were removed by simple distillation or distillation under reduced pressure. The recovered bis(chloromethylsilyl)amine ((SiHCl$CH_3)_2NH$)) solution was stirred with pentane (n-Pentane), and 699 g (15.5 mol) of dimethylamine (($CH_3)_2NH$) was slowly added while maintaining the temperature to $-25°$ C. After the addition was completed, the reaction solution was slowly heated to room temperature and stirred for 6 hours. After the reaction was completed, the obtained reaction mixture was filtered to obtain a white solid, and the obtained white solid was removed to obtain a filtrate. From the filtrate, the solvent was removed under reduced pressure, and distillation under reduced pressure was performed to obtain 444 g (2.32 mol) of bis(dimethylamino)methylsilylamine ((SiHCH$_3$N(CH$_3)_2)_2$NH) in a yield of 75%.

$^1$H-NMR($C_6D_6$):δ 2.45(s, 12H, ((SiHCH$_3$N(CH$_3)_2)_2$NH), 0.11(t, 6H, ((SiHCH$_3$N(CH$_3)_2)_2$NH), 0.4(d, 1H, (SiHCH$_3$N(CH$_3)_2)_2$NH, 4.70(m, 2H, (SiHCH$_3$N(CH$_3)_2)_2$NH

Step 2: Preparation of bis(methylsilyl)dimethylaminomethylsilyl amine

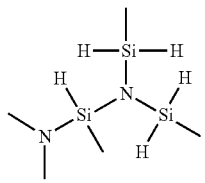

444 g (2.32 mol) of the prepared bis(dimethylamino) methylsilylamine ((SiHCH$_3$N(CH$_3)_2)_2$NH) and 500 ml of n-hexane were added to a flame-dried 5000 mL Schlenk flask under an anhydrous and inert atmosphere, 655 g (2.4 mol) of a 2.52 M concentration of normal butyl lithium (n-$C_4H_9Li$) hexane ($C_6H_{14}$) solution was slowly added while maintaining a temperature to $-10°$ C. After the addition was completed, the reaction solution was slowly heated to $65°$ C. and stirred for 6 hours, and then the solvent was removed by distillation under reduced pressure. 500 ml of tetrahydrofuran (O($C_2H_2)_2$)) was added to the reaction mixture from which the solvent was removed, the obtained reaction mixture was slowly added at $-10°$ C. to a mixed solution in which 267 g (2.3 mol) of dichloromethylsilane (($CH_3)SiCl_2H$) and tetrahydrofuran (O($C_2H_2)_2$)), and resulting the reaction mixture was stirred for 8 hours while maintaining an internal temperature of the reaction to $-10°$ C. After the stirring was completed, 32 g (4.0 mol) of lithium hydride (LiH) was added to the mixed solution, and then the reaction mixture was stirred for 12 hours while maintaining the temperature to $65°$ C. After the reaction was completed, the obtained reaction mixture was filtered to obtain a white solid, and the obtained white solid was removed to obtain a filtrate. From the filtrate, the solvent was removed under reduced pressure, and distillation under reduced pressure was performed to obtain 200 g (1.03 mol) of bis(methylsilyl) dimethylamino methylsilylamine ((SiH$_2$CH$_3)_2$(SiHCH$_3$N(CH$_3)_2$))N in a yield of 50%.

$^1$H-NMR($C_6D_6$):δ 0.19(t, 6H, ((SiH$_2$CH$_3)_2$(SiHCH$_3$N(CH$_3)_2$))N, 0.19(d, 3H, ((SiH$_2$CH$_3)_2$(SiHCH$_3$N(CH$_3)_2$))N, 2.39(s, 6H, ((SiH$_2$CH$_3)_2$(SiHCH$_3$N(CH$_3)_2$))N, 4.66(q, 4H, ((SiH$_2$CH$_3)_2$(SiHCH$_3$N(CH$_3)_2$))N, 4.81(q, 1H, ((SiH$_2$CH$_3)_2$(SiHCH$_3$N(CH$_3)_2$))N

Figure 2:
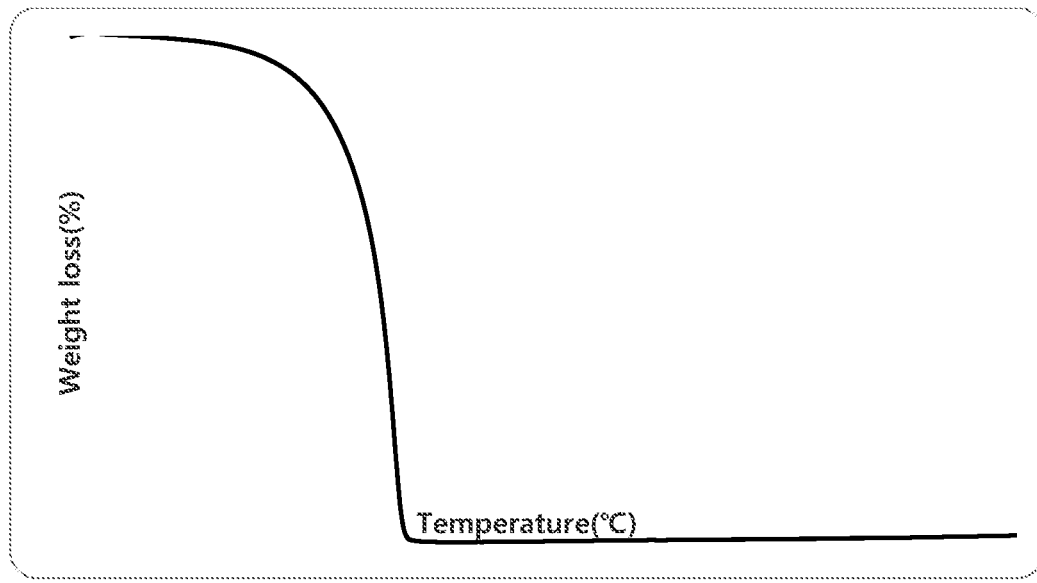
FIG. 2 is a graph showing thermogravimetric analysis and measurement results of a bis(methylsilyl)dimethylamino methylsilylamine compound prepared in Example 1.

The vapor pressure measurement and the thermogravimetric analysis of the bis(methylsilyl)dimethylamino methylsilylamine compound were performed and shown in FIGS. 1 and 2.

It could be appreciated from FIGS. 1 and 2 that the bis(methylsilyl)dimethylamino methylsilylamine compound of Example 1 had high volatility with a vapor pressure of 10 torr or more only at $70°$ C. and had excellent thermal stability, which is very preferable as a silicon precursor for depositing a silicon-containing thin film.

EXAMPLE 2

Production of Silicon Oxide Film by Plasma Enhanced Atomic Layer Deposition (PEALD) Using Bis(Methylsilyl)Dimethylamino Methylsilylamine Film formation evaluation was conducted by using bis (methylsilyl)dimethylamino methylsilylamine prepared in Example 1 as the composition for forming a silicon oxide film in general plasma enhanced atomic layer deposition (PEALD) equipment using the known PEALD. As the reactive gas, oxygen was used together with plasma, and argon, which is an inert gas, was used for the purpose of purging. The film formation evaluation was conducted at 1.5 seconds for the reactive gas and plasma. The number of depositions was 270 cycles, and Table 1 shows a specific method for depositing a silicon oxide film.

Figure 3:
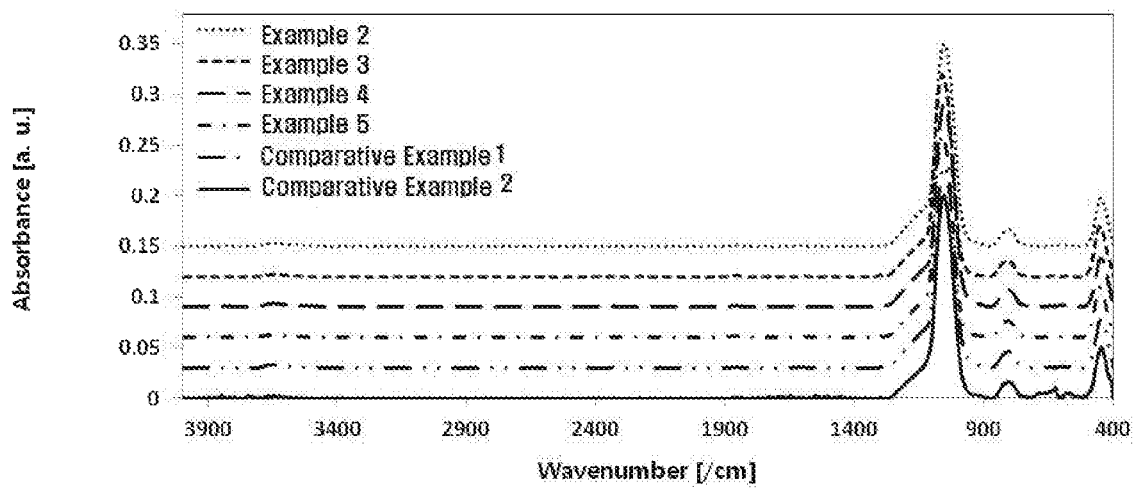
FIG. 3 shows infrared spectrometer analysis results of silicon-containing thin films prepared and deposited in Examples 2 and 5.

A thickness of the deposited thin film was measured through an ellipsometer, the formation of the silicon oxide film was analyzed using an infrared spectrophotometer, and the composition of the silicon oxide film was analyzed using an X-ray photoelectron spectrometer. Further, stress of the silicon oxide film was analyzed using a stress gauge, and water vapor permeability of the thin film was measured using a water vapor permeability tester for measurement of the water vapor permeability of the thin film. Table 2 below shows specific analysis results of the silicon oxide film, and FIG. 3 shows analysis results of the film deposited using the infrared spectrometer.

EXAMPLE 3

Production of Silicon Oxide Film by Plasma Enhanced Atomic Layer Deposition (PEALD) Using Bis(Methylsilyl)Dimethylamino Methylsilylamine Film formation evaluation was conducted by using bis (methylsilyl)dimethylamino methylsilylamine prepared in Example 1 as the composition for forming a silicon oxide film in general plasma enhanced atomic layer deposition (PEALD) equipment using the known PEALD. As the reactive gas, oxygen was used together with plasma, and argon, which is an inert gas, was used for the purpose of purging. The film formation evaluation was conducted at 1.5 seconds for the reactive gas and plasma. The number of depositions was 188 cycles, and Table 1 shows a specific method for depositing a silicon oxide film. In addition, FIG. 3 below shows analysis results of the film deposited using the infrared spectrometer.

EXAMPLE 4

Production of Silicon Oxide Film by Plasma Enhanced Atomic Layer Deposition (Peald) Using Bis(Methylsilyl)Dimethylamino Methylsilylamine Film formation evaluation was conducted by using bis (methylsilyl)dimethylamino methylsilylamine prepared in Example 1 as the composition for forming a silicon oxide film in general plasma enhanced atomic layer deposition (PEALD) equipment using the known PEALD. As the reactive gas, oxygen was used together with plasma, and argon, which is an inert gas, was used for the purpose of purging. The film formation evaluation was conducted at 1.5 seconds for the reactive gas and plasma. The number of depositions was 113 cycles, and Table 1 shows a specific method for depositing a silicon oxide film. In addition, FIG. 3 below shows analysis results of the film deposited using the infrared spectrometer.

EXAMPLE 5

Production of Silicon Oxide Film by Plasma Enhanced Atomic Layer Deposition (PEALD) Using Bis(Methylsilyl)Dimethylamino Methylsilylamine Film formation evaluation was conducted by using bis (methylsilyl)dimethylamino methylsilylamine prepared in Example 1 as the composition for forming a silicon oxide film in general plasma enhanced atomic layer deposition (PEALD) equipment using the known PEALD. As the reactive gas, oxygen was used together with plasma, and argon, which is an inert gas, was used for the purpose of purging. The film formation evaluation was conducted at 1.5 seconds for the reactive gas and plasma. The number of depositions was 82 cycles, and Table 1 shows a specific method for depositing a silicon oxide film. In addition, FIG. 3 below shows analysis results of the film deposited using the infrared spectrometer.

COMPARATIVE EXAMPLE 1

Production of Silicon Oxide Film by Plasma Enhanced Atomic Layer Deposition (PEALD) Using Dimethylaminodimethylsilyl Bisdimethylsilylamine Film formation evaluation was conducted by using the dimethylaminodimethylsilyl bisdimethylsilylamine compound as a Comparative Example for forming a silicon oxide film in general plasma enhanced atomic layer deposition (PEALD) equipment using the known PEALD. As the reactive gas, oxygen was used together with plasma, and argon, which is an inert gas, was used for the purpose of purging. The film formation evaluation was conducted at 1.5 seconds for the reactive gas and plasma. Table 1 shows a specific method for depositing a silicon oxide film.

A thickness of the deposited thin film was measured through an ellipsometer, the formation of the silicon oxide film was analyzed using an infrared spectrophotometer, and the composition of the silicon oxide film was analyzed using an X-ray photoelectron spectrometer. Further, stress of the silicon oxide film was analyzed using a stress gauge, and water vapor permeability of the thin film was measured using a water vapor permeability tester for measurement of the water vapor permeability of the thin film. Table 2 below shows specific analysis results of the silicon oxide film.

COMPARATIVE EXAMPLE 2

Production of Silicon Oxide Film by Plasma Enhanced Atomic Layer Deposition (PEALD) Using Bisdiethylaminosilane Film formation evaluation was conducted by using the bisdiethylaminosilane compound as a Comparative Example for forming a silicon oxide film in general plasma enhanced atomic layer deposition (PEALD) equipment using the known PEALD. As the reactive gas, oxygen was used together with plasma, and argon, which is an inert gas, was used for the purpose of purging. The film formation evaluation was conducted at 1.0 seconds for the reactive gas and plasma. Table 1 shows a specific method for depositing a silicon oxide film.

A thickness of the deposited thin film was measured through an ellipsometer, the formation of the silicon oxide film was analyzed using an infrared spectrophotometer, and the composition of the silicon oxide film was analyzed using an X-ray photoelectron spectrometer. Further, stress of the silicon oxide film was analyzed using a stress gauge, and water vapor permeability of the thin film was measured using a water vapor permeability tester for measurement of the water vapor permeability of the thin film. Table 2 below shows specific analysis results of the silicon oxide film.

TABLE 1

Deposition conditions of silicon oxide by plasma enhanced atomic layer deposition

| | Precursor | Precursor heating temperature (°C.) | Substrate temperature (°C.) | Precursor injection time (sec) | Purge Flow rate (scm) | Purge Time (sec) |
|---|---|---|---|---|---|---|
| Example 2 | Bis(methylsilyl) dimethylamino methylsilylamine | 70 | 90 | 0.1 | 600 | 0.4 |

TABLE 1-continued

Deposition conditions of silicon oxide by plasma enhanced atomic layer deposition

| | | | | | | |
|---|---|---|---|---|---|---|
| Example 3 | Bis(methylsilyl)dimethylamino methylsilylamine | 70 | 90 | 0.1 | 600 | 0.4 |
| Example 4 | Bis(methylsilyl)dimethylamino methylsilylamine | 70 | 90 | 0.1 | 600 | 0.4 |
| Example 5 | Bis(methylsilyl)dimethylamino methylsilylamine | 70 | 90 | 0.1 | 600 | 0.4 |
| Comparative Example 1 | Bimethylamino-dimethylsilyl bisdimethylsilylamine | 83 | 90 | 0.1 | 600 | 0.1 |
| Comparative Example 2 | Bisdiethylaminosilane | 51 | 90 | 0.1 | 600 | 0.4 |

| | Reactive gas (oxygen) and plasma | | | Argon gas purge | | | |
|---|---|---|---|---|---|---|---|
| | Flow rate (sccm) | RF power (W) | Time (sec) | Time (sec) | Flow rate (sccm) | Number of depositions Cycle | Processing time (sec) |
| Example 2 | 400 | 400 | 1.5 | 300 | 0.1 | 270 | 572 |
| Example 3 | 400 | 400 | 1.5 | 300 | 0.1 | 189 | 409 |
| Example 4 | 400 | 400 | 1.5 | 300 | 0.1 | 113 | 245 |
| Example 5 | 400 | 400 | 1.5 | 300 | 0.1 | 39 | 82 |
| Comparative Example 1 | 400 | 400 | 1.5 | 300 | 0.1 | 769 | 1129 |
| Comparative Example 2 | 400 | 400 | 1.0 | 300 | 0.1 | 615 | 923 |

TABLE 2

Evaluation of properties of silicon oxide film

| | Variable | | Deposition rate (Å/cycle) | Thin film thickness (Å) | Refractive index | O/Si atomic ratio | Stress of film (MPa) | Water vapor permeability (g/[m$^2$-day]) |
|---|---|---|---|---|---|---|---|---|
| Example 2 | Cycle | 270 | 2.57 | 809 | 1.48 | 1.79 | −331 | $5.02*10^{-3}$ |
| Example 3 | | 188 | 2.57 | 483 | 1.48 | 1.79 | −70.2 | $1.53*10^{-2}$ |
| Example 4 | | 113 | 2.57 | 290 | 1.48 | 1.79 | −25.1 | $1.50*10^{-1}$ |
| Example 5 | | 38 | 2.57 | 98 | 1.48 | 1.79 | — | $6.50*10^{-1}$ |
| Comparative Example 1 | RF time (sec) | 1.5 | 0.91 | 700 | 1.47 | — | — | — |
| Comparative Example 2 | | 1.0 | 1.14 | 700 | 1.48 | — | — | — |

As could be appreciated from Tables 1 and 2, it was shown that in Examples 2 to 5, the deposition rate based on the total deposition time was 69.58 to 72.79 Å/min, and the deposition rate based on the deposition cycle was 2.57 Å/cycle, and in Comparative Examples 1 and 2, the deposition rate based on the total deposition time had a range of 37.19 to 45.58 Å/min, and the deposition rate based on the deposition cycle had a range of 0.91 to 1.14 Å/cycle. It could be appreciated that the thin films of Examples 2 to 5 were deposited at a deposition temperature of 100° C. or less at an excellent deposition rate, which was at least 1.5 times to 1.9 times higher than that of Comparative Examples 1 to 2.

In addition, the refractive indexes of Examples 2 to 5 were 1.48, the refractive index of Comparative Example 1 was 1.47, and the refractive index of Example 2 was 1.48.

Further, the O/Si atomic ratios of Examples 2 to 5 were 1.79. From FIG. 3, it was confirmed that Examples 2 to 5 and Comparative Examples 1 to 2 were all insulating films containing Si—O bonds, and it could be confirmed that the thin film thickness was 809 Å, the thin films had a remarkably high stress of −331 MPa and a remarkably low water vapor permeability of $5.02*10^{-3}$ g/[m$^2$-day]. Thus, it could be confirmed that the bis(methylsilyl)dimethylamino methylsilylamine compounds of Examples 2 to 5 were capable of forming a high-quality silicon oxide film having high stress and low water vapor permeability as compared to those of Comparative Examples 1 to 2.

EXAMPLE 6

Production of Silicon Nitride Film by Plasma Enhanced Atomic Layer Deposition (PEALD) Using Bis(Methylsilyl)Dimethylamino Methylsilylamine Film formation evaluation was conducted by using bis(methylsilyl)dimethylamino methylsilylamine prepared in Example 1 as the composition for forming a silicon nitride film in general plasma enhanced atomic layer deposition (PEALD) equipment using the known PEALD. As the reactive gas, ammonia and nitrogen were used together with the plasma, and nitrogen, which is an inert gas, was used for the purpose of purging. The film formation evaluation was conducted by changing the time for the reactive gas and plasma. Table 3 shows a specific method for depositing a silicon nitride film.

A thickness of the deposited thin film was measured through an ellipsometer, the formation of the silicon nitride film was analyzed using an infrared spectrophotometer, and the composition of the silicon nitride film was analyzed using an X-ray photoelectron spectrometer. Further, stress of the silicon nitride film was analyzed using a stress gauge, and water vapor permeability of the thin film was measured using a water vapor permeability tester for measurement of the water vapor permeability of the thin film. Table 4 below shows specific analysis results of the silicon nitride film, and FIG. 6 shows analysis results of the film deposited using the infrared spectrometer.

EXAMPLE 7

Figure 4:
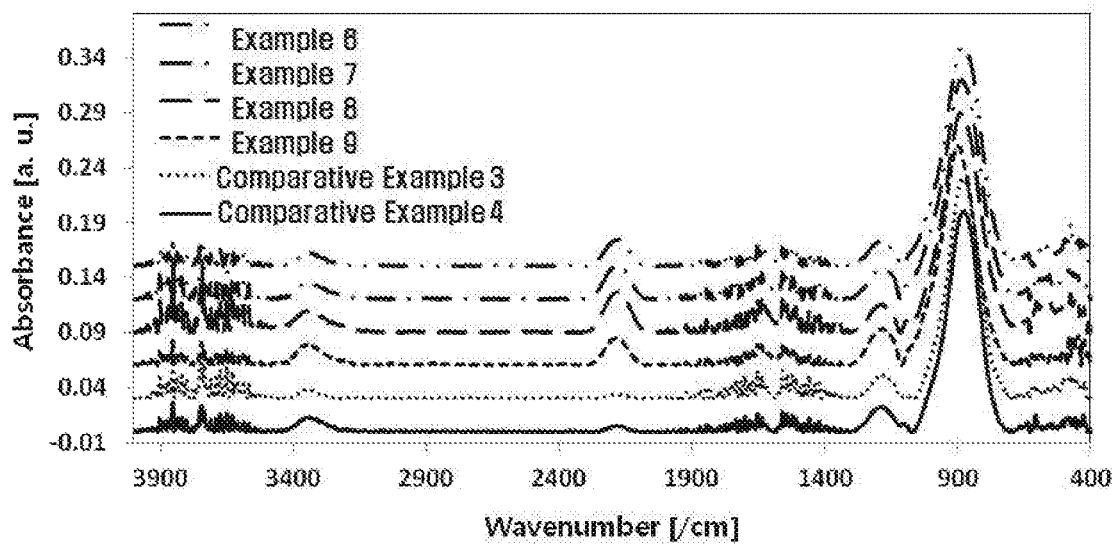
FIG. 4 shows infrared spectrometer analysis results of silicon-containing thin films prepared and deposited in Examples 6 and 9.

Production of Silicon Nitride Film by Plasma Enhanced Atomic Layer Deposition (PEALD) Using Bis(Methylsilyl)Dimethylamino Methylsilylamine Film formation evaluation was conducted by using the known PEALD under the same deposition conditions as in Example 6 except that time for the ammonia reactive gas and plasma was 0.8 seconds, and time for the nitrogen reactive gas and plasma was 1.5 seconds as described in Table 3, and the deposited thin film was analyzed by using the same analysis method and conditions as those in Example 6, and analysis results thereof were secured. Tables 3 and 4 below show a specific method for depositing a silicon nitride film and analysis results. Further, FIG. 4 shows the deposited films analyzed through an infrared spectrometer.

EXAMPLE 8

Production of Silicon Nitride Film by Plasma Enhanced Atomic Layer Deposition (PEALD) Using Bis(Methylsilyl)Dimethylamino Methylsilylamine Film formation evaluation was conducted by using the known PEALD under the same deposition conditions as in Example 6 except that RF power was 800 W, time for the ammonia reactive gas and plasma was 0.6 seconds, and time for the nitrogen reactive gas and plasma was 1.0 second as described in Table 3, and the deposited thin film was analyzed by using the same analysis method and conditions as those in Example 6, and analysis results thereof were secured. Tables 3 and 4 below show a specific method for depositing a silicon nitride film and analysis results. Further, FIG. 4 shows the deposited films analyzed through an infrared spectrometer.

EXAMPLE 9

Production of Silicon Nitride Film by Plasma Enhanced Atomic Layer Deposition (PEALD) Using Bis(Methylsilyl)Dimethylamino Methylsilylamine Film formation evaluation was conducted by using the known PEALD under the same deposition conditions as in Example 6 except that RF power was 800 W, time for the ammonia reactive gas and plasma was 0.6 seconds, and time for the nitrogen reactive gas and plasma was 0.8 second as described in Table 3, and the deposited thin film was analyzed by using the same analysis method and conditions as those in Example 6, and analysis results thereof were secured. Tables 3 and 4 below show a specific method for depositing a silicon nitride film and analysis results. Further, FIG. 4 shows the deposited films analyzed through an infrared spectrometer.

COMPARATIVE EXAMPLE 3

Production of Silicon Nitride Film B by Plasma Enhanced Atomic Layer Deposition (PEALD) Using Dimethylaminodimethylsilyl Bisdimethylsilylamine Film formation evaluation was conducted by using dimethylaminodimethylsilyl bisdimethylsilylamine compound as the composition for forming a silicon nitride film in general plasma enhanced atomic layer deposition (PEALD) equipment using the known PEALD. As the reactive gas, ammonia and nitrogen were used together with the plasma, and nitrogen, which is an inert gas, was used for the purpose of purging. The film formation evaluation was conducted by changing the time for the reactive gas and plasma. Table 3 shows a specific method for depositing a silicon nitride film.

A thickness of the deposited thin film was measured through an ellipsometer, the formation of the silicon nitride film was analyzed using an infrared spectrophotometer, and the composition of the silicon nitride film was analyzed using an X-ray photoelectron spectrometer. Further, stress of the silicon nitride film was analyzed using a stress gauge, and water vapor permeability of the thin film was measured using a water vapor permeability tester for measurement of the water vapor permeability of the thin film. Table 4 below shows specific analysis results of the silicon nitride film, and FIG. 4 shows analysis results of the film deposited using the infrared spectrometer.

COMPARATIVE EXAMPLE 4

Production of Silicon Nitride Film by Plasma Enhanced Atomic Layer Deposition (PEALD) Using Bisdiethylaminosilane Film formation evaluation was conducted by using bisdiethylaminosilane compound as the composition for forming a silicon nitride film in general plasma enhanced atomic layer deposition (PEALD) equipment using the known PEALD. As the reactive gas, ammonia and nitrogen were used together with the plasma, and nitrogen, which is an inert gas, was used for the purpose of purging. The film formation evaluation was conducted by changing the time for the reactive gas and plasma. Table 3 shows a specific method for depositing a silicon nitride film.

A thickness of the deposited thin film was measured through an ellipsometer, the formation of the silicon nitride film was analyzed using an infrared spectrophotometer, and the composition of the silicon nitride film was analyzed using an X-ray photoelectron spectrometer. Further, stress of the silicon nitride film was analyzed using a stress gauge, and water vapor permeability of the thin film was measured using a water vapor permeability tester for measurement of the water vapor permeability of the thin film. Table 4 below shows specific analysis results of the silicon nitride film, and FIG. 4 shows analysis results of the film deposited using the infrared spectrometer.

TABLE 3

Deposition conditions of silicon nitride film by plasma enhanced atomic layer deposition

|  | Precursor | Precursor heating temperature (°C.) | Substrate temperature (°C.) | Precursor injection time (sec) | Purge Flow rate (sccm) | Purge Time (sec) | Reactive gas (ammonia) and plasma Flow rate (sccm) | Reactive gas (ammonia) and plasma RF power | Reactive gas (ammonia) and plasma Time (sec) |
|---|---|---|---|---|---|---|---|---|---|
| Example 6 | Bis(methylsilyl) dimethylamino methylsilylamine | 62 | 90 | 0.4 | 600 | 0.4 | 2000 | 600 | 1.0 |
| Example 7 | Bis(methylsilyl) dimethylamino methylsilylamine | 62 | 90 | 0.4 | 600 | 0.4 | 2000 | 600 | 0.9 |
| Example 8 | Bis(methylsilyl) dimethylamino methylsilylamine | 62 | 90 | 0.4 | 600 | 0.4 | 2000 | 800 | 0.6 |
| Example 9 | Bis(methylsilyl) dimethylamino methylsilylamine | 62 | 90 | 0.4 | 600 | 0.4 | 2000 | 800 | 0.6 |
| Comparative Example 3 | Dimethylaminodimethylsilyl bisdimethlysilylamine | 83 | 90 | 0.4 | 600 | 0.1 | 2000 | 600 | 1.0 |
| Comparative Example 4 | Bisdiethylaminosilane | 51 | 90 | 0.4 | 600 | 0.4 | 2000 | 600 | 1.0 |

|  | Reactive gas (Nitrogen) and plasma Flow rate (sccm) | Reactive gas (Nitrogen) and plasma RF power (W) | Reactive gas (Nitrogen) and plasma Time (sec) | Nitrogen gas purge Time (sec) | Nitrogen gas purge Flow rate (sccm) | Number of depositions Cycle | Processing time (sec) |
|---|---|---|---|---|---|---|---|
| Example 6 | 6000 | 600 | 2.0 | 0.4 | 6000 | 270 | 572 |
| Example 7 | 6000 | 600 | 1.5 | 0.4 | 6000 | 188 | 409 |
| Example 8 | 6000 | 600 | 1.0 | 0.4 | 6000 | 113 | 245 |
| Example 9 | 6000 | 600 | 0.8 | 0.4 | 6000 | 38 | 82 |
| Comparative Example 3 | 6000 | 600 | 2.0 | 0.4 | 6000 | 769 | 1129 |
| Comparative Example 4 | 6000 | 600 | 2.0 | 0.4 | 6000 | 615 | 923 |

TABLE 4

Evaluation of properties of silicon nitride film

|  | Variable |  | Deposition rate (Å/cycle) | Thin film thickness (Å) | Water vapor permeability (g/[m² − day]) |
|---|---|---|---|---|---|
| Example 6 | Cycle | 270 | 0.65 | 200 | $1.6*10^{-3}$ |
| Example 7 |  | 188 | 0.65 | 200 | $4.1*10^{-3}$ |
| Example 8 |  | 113 | 0.65 | 200 | $4.2*10^{-3}$ |
| Example 9 |  | 38 | 0.65 | 200 | $3.4*10^{-3}$ |
| Comparative Example 3 | RF time Ammonia/ | 1.0/2.0 | 0.2 | 200 | $1.07*10^{-2}$ |
| Comparative Example 4 | nitrogen (sec) | 1.0/2.0 | 0.25 | 200 | $1.53*10^{-2}$ |

It could be appreciated from Tables 3 and 4 that at the deposition of Examples 6 to 9, the deposition rate based on the total deposition time was 8.46 to 12.97 Å/min and the deposition rate based on the deposition cycle was 0.65 Å/cycle. Further, it was shown that at the time of deposition of Comparative Examples 3 to 4, the deposition rate based on the total deposition time had a range of 2.60 to 3.26 Å/min, and the deposition rate based on the deposition cycle had a range of 0.20 to 0.25 Å/cycle. In addition, the compound of Comparative Example 3 showed a lower deposition rate than the compound of the present invention even when the silicon nitride film was produced by performing deposition at a high temperature of 300° C. On the other hand, the composition for depositing a silicon-containing thin film of the present invention showed a very high deposition rate even at a significantly low temperature of 100° C. or less. As a result, when the precursor according to the present invention was used as in Examples 6 to 9, it could be appreciated that the thin film was deposited at a very high deposition rate, which was at least 2.6 times to 4.9 times higher than those of other silicon precursors.

Further, as a result of the analysis of the produced nitride film, it was confirmed that insulating films including Si—N bonds were produced in all of Examples 6 to 9 and Comparative Examples 3 to 4, and it was confirmed that a nitride film having a Si/N atomic ratio of 0.85 was produced in Example 6, a nitride film having a Si/N atomic ratio of 0.87 was produced in Example 7, a nitride film having a Si/N atomic ratio of 0.87 was produced in Example 8, and a nitride film having a Si/N atomic ratio of 0.96 was produced in Example 9. Further, in Examples 6 to 9, it was confirmed that nitride films having refractive indexes of 1.84, 1.82, 1.81 and 1.77 were produced. In addition, it could be confirmed that the nitride films produced in Examples 6 to 9 had significantly excellent water vapor permeability which was at least 10 times to 20 times higher than those of the nitride films produced in Comparative Examples 3 to 4, wherein all of the nitride films had the same thin film thickness.

In other words, when a silicon-containing thin film is produced using the composition for depositing a silicon-containing thin film including the trisilylamine compound represented by Chemical Formula 1 according to the present invention, it may be appreciated that a high-quality silicon-containing thin film having a high purity, a high stress, and a high water vapor permeability at a low temperature of 100° C. or less is formed at a surprisingly rapid rate. Further, it may be appreciated that the silicon-containing thin film produced by using the composition for depositing a silicon-containing thin film of the present invention has excellent stress intensity and remarkably low water vapor permeability, thereby being very useful for an encapsulant in the fields of a semiconductor or a display, and further being capable of forming the encapsulant at a very high deposition rate at 100° C. or less, and thus a protection object to be protected by the encapsulant is free from thermal damage.

Hereinabove, although the present invention is described by specific matters, limited exemplary embodiments, and drawings, they are provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the above-described exemplary embodiments, and the following claims as well as all modified equally or equivalently to the claims are intended to fall within the scopes and spirits of the invention.

The invention claimed is:

1. A composition for depositing a silicon-containing thin film containing a trisilylamine compound represented by Chemical Formula 1 below:

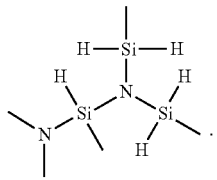

(Chemical Formula 1)

2. A method for producing a silicon-containing thin film, comprising:
supplying a trisilylamine compound represented by Chemical Formula 1 below to a chamber in which a substrate to be deposited is placed:

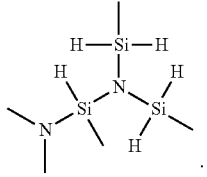

(Chemical Formula 1)

3. The method of claim 2, wherein a temperature of the substrate to be deposited is less than 100° C.

4. The method of claim 3, wherein the temperature of the substrate to be deposited is 95° C. or less.

5. The method of claim 3, wherein the silicon-containing thin film is a silicon nitride film, and a deposition rate of the silicon-containing thin film is 8 Å/min or more.

6. The method of claim 3, wherein the silicon-containing thin film is a silicon oxide film, and a deposition rate of the silicon-containing thin film is 70 Å/min or more.

7. The method of claim 2, wherein before, during, and/or after the supplying of the trisilylamine compound, any one or two or more gases are supplied, the gases being selected from oxygen ($O_2$), ozone ($O_3$), distilled water ($H_2O$), hydrogen peroxide ($H_2O_2$), nitrogen monoxide (NO), nitrous oxide ($N_2O$), nitrogen dioxide ($NO_2$), ammonia ($NH_3$), nitrogen ($N_2$), hydrazine ($N_2H_4$), hydrazine derivatives, diamines, carbon monoxide (CO), carbon dioxide ($CO_2$), C1-C12 saturated or unsaturated hydrocarbons, hydrogen, argon, and helium.

8. The method of claim 2, further comprising:
a) heating and maintaining the substrate to be deposited which is placed in the chamber to a deposition temperature;
b) contacting the substrate to be deposited with the trisilylamine compound and adsorbing the trisilylamine compound onto the substrate to be deposited; and
c) injecting a reactive gas into the substrate to be deposited on which the trisilylamine compound is adsorbed.

9. The method of claim 8, wherein the silicon-containing thin film is a silicon nitride film, and when the steps a) to c) are performed in one cycle, a deposition rate of the silicon nitride film per cycle is 0.65 Å/cycle or more.

10. The method of claim 8, wherein the silicon-containing thin film is a silicon oxide film, and when the steps a) to c) are performed in one cycle, a deposition rate of the silicon oxide film per cycle is 2.5 Å/cycle or more.

11. The method of claim 8, wherein the reactive gas is selected from an oxygen-containing gas, a nitrogen-containing gas, a carbon-containing gas, an inert gas, or a mixed gas thereof, and is a plasma-activated gas.

12. The method of claim 2, wherein the silicon-containing thin film is one or two or more selected from a silicon oxide thin film, a silicon oxycarbide thin film, a silicon carbonitride thin film, a silicon nitride thin film, a silicon oxynitride thin film, a silicon oxycarbonitride thin film, and a silicon carbide thin film.

13. A silicon-containing thin film produced by supplying a trisilylamine compound represented by Chemical Formula 1 to a chamber in which a substrate to be deposited is placed:

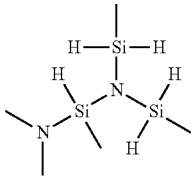

(Chemical Formula 1)

14. The composition of claim 1, wherein the silicon-containing thin film is one or two or more selected from a silicon oxide thin film, a silicon oxycarbide thin film, a silicon carbonitride thin film, a silicon nitride thin film, a silicon oxynitride thin film, a silicon oxycarbonitride thin film, and a silicon carbide thin film.

* * * * *